US011136690B1

United States Patent
Wang et al.

(10) Patent No.: US 11,136,690 B1
(45) Date of Patent: Oct. 5, 2021

(54) METHOD FOR PREPARING DOPED YTTRIUM ALUMINUM GARNET SINGLE CRYSTAL FIBER BY PERFORMING A CYLINDRICAL SURFACE POLISHING OPERATION AND GROWING A CLADDING LAYER

(71) Applicant: MEISHAN BOYA ADVANCED MATERIALS CO., LTD., Sichuan (CN)

(72) Inventors: Yu Wang, Meishan (CN); Peng Gu, Meishan (CN); Zhenxing Liang, Meishan (CN)

(73) Assignee: MEISHAN BOYA ADVANCED MATERIALS CO., LTD., Meishan (CN)

( * ) Notice: Subject to any disclaimer, the term of this patent is extended or adjusted under 35 U.S.C. 154(b) by 0 days.

(21) Appl. No.: 17/340,083

(22) Filed: Jun. 6, 2021

(30) Foreign Application Priority Data

Jun. 10, 2020 (CN) .......................... 202010524188.5

(51) Int. Cl.
*C30B 7/10* (2006.01)
*C30B 29/28* (2006.01)
(Continued)

(52) U.S. Cl.
CPC ................. *C30B 7/10* (2013.01); *C30B 7/14* (2013.01); *C30B 29/28* (2013.01); *H01S 3/06708* (2013.01); *H01S 3/1643* (2013.01)

(58) Field of Classification Search
CPC .. C30B 7/00; C30B 7/005; C30B 7/10; C30B 7/14; C30B 15/00; C30B 15/20;
(Continued)

(56) References Cited

U.S. PATENT DOCUMENTS

| | | | |
|---|---|---|---|
| 2013/0344277 A1* | 12/2013 | Kolis | .................... C30B 29/30 428/64.1 |
| 2021/0180209 A1 | 6/2021 | Wang et al. | |
| 2021/0230767 A1 | 7/2021 | Wang et al. | |

FOREIGN PATENT DOCUMENTS

| | | |
|---|---|---|
| CN | 1424437 A | 6/2003 |
| CN | 1477239 A | 2/2004 |

(Continued)

OTHER PUBLICATIONS

First search in Chinese Application No. 202010524188.5 dated Jul. 24, 2020, 14 pages.

(Continued)

*Primary Examiner* — Kenneth A Bratland, Jr.
(74) *Attorney, Agent, or Firm* — Metis IP LLC

(57) ABSTRACT

The present disclosure provides a method for preparing a doped YAG single crystal fiber. The method may include placing a doped YAG single crystal fiber core into a growth zone and placing a raw material into a dissolution zone; adding a mineralizer into the growth chamber to cause the mineralizer to immerse the raw material and the doped YAG single crystal fiber core; heating the growth zone and the dissolution zone by a two-stage heating device, respectively; and preparing a doped YAG single crystal fiber by growing a YAG single crystal fiber cladding on a surface of the doped YAG single crystal fiber core based on the doped YAG single crystal fiber core and the raw material under a preset pressure.

9 Claims, 8 Drawing Sheets

(51) Int. Cl.
*C30B 7/14* (2006.01)
*H01S 3/16* (2006.01)
*H01S 3/067* (2006.01)

(58) Field of Classification Search
CPC ......... C30B 15/36; C30B 29/00; C30B 29/10; C30B 29/16; C30B 29/22; C30B 29/24; C30B 29/28; H01S 3/06708; H01S 3/1643
USPC ......... 117/13, 19, 35, 68, 71, 902, 937, 945, 117/947
See application file for complete search history.

(56) References Cited

FOREIGN PATENT DOCUMENTS

| CN | 103792619 A | 5/2014 |
|---|---|---|
| CN | 104015121 A | 9/2014 |
| CN | 205254761 U | 5/2016 |
| CN | 107151092 A | 9/2017 |
| CN | 107900790 A | 4/2018 |
| CN | 109575813 A | 4/2019 |
| CN | 109870830 A | 6/2019 |
| CN | 110158150 A | 8/2019 |
| CN | 110187432 A | 8/2019 |
| CN | 110257919 A | 9/2019 |
| CN | 110284193 A | 9/2019 |
| CN | 111254486 A | 6/2020 |
| JP | 2001019941 A | 1/2001 |
| JP | 2005029418 A | 2/2005 |
| JP | 2005114788 A * | 4/2005 |

OTHER PUBLICATIONS

Notification to Grant Patent in Chinese Application No. 202010524188.5 dated Sep. 3, 2020, 5 pages.
Michael Cable, Mechanization of Class Manufacture, Journal of the American Ceramic Society, 82(5): 1093-1112, 1999, 20 pages.
Fang, Zaijin, Fabrication and Spectral Conversion of Transparent Glass Ceramics and Glass Ceramic Fibers, China Doctoral Dissertations Full-text Database Information Technology, 2016, 128 pages.
Li, Yuanxun, Preparation and Performance Characterization of Functional Materials, 2018, 13 pages.
The second Office Action in Chinese Application No. 202010524188.5 dated Aug. 13, 2020, 15 pages.
First Office Action in Chinese Application No. 202011032847.X dated Feb. 19, 2021, 31 pages.
Yu, Lu, Study on $Yb^{3+}/Tm^{3+}$ Codoped YAG or $Y_2O_3$ Single Crystal Fiber Upconversion Fluorescence Temperature Sensing Technology, Chinese Master's Theses Full-text Database, Engineering Science and Technology I, 2019, 69 pages.
F. Beier et al., Narrow Linewidth, Single Mode 3 kW Average Power From a Directly Diode Pumped Ytterbium-doped Low NA Fiber Amplifier, Optics Express, 24(6): 6011-6020, 2016.

* cited by examiner

METHOD FOR PREPARING DOPED YTTRIUM ALUMINUM GARNET SINGLE CRYSTAL FIBER BY PERFORMING A CYLINDRICAL SURFACE POLISHING OPERATION AND GROWING A CLADDING LAYER

CROSS-REFERENCE TO RELATED APPLICATIONS

This application claims priority to Chinese Patent Application No. 202010524188.5 filed on Jun. 10, 2020, the contents of which are hereby incorporated by reference.

TECHNICAL FIELD

The present disclosure generally relates to the field of fiber, and in particular, to methods for preparing a doped Yttrium Aluminum Garnet (YAG) single crystal fiber.

BACKGROUND

Fiber-based laser devices are widely used in fields such as optoelectronics, optical communication, superconducting technologies, etc., due to their excellent performances. Single crystal fiber, which has the advantages of both crystal and fiber, has better performances, such as a higher mechanical strength, a higher thermal conductivity, a higher pump efficiency, a higher beam quality, a lower transmission loss, etc. However, for traditional techniques for preparing single crystal fibers and/or corresponding fiber cores, the costs are relatively high, the operation difficulties are relatively high, and the diameter of the prepared single crystal fiber is uneven, resulting in a high transmission loss. Therefore, it is desirable to provide methods for conveniently and quickly preparing a single crystal fiber having a uniform diameter, a relatively high thermal conductivity, and a relatively low transmission loss.

SUMMARY

According to an aspect of the present disclosure, a method for preparing a doped Yttrium Aluminum Garnet (YAG) single crystal fiber may be provided. The method may include preparing a doped YAG crystal ingot. The method may also include preparing a doped YAG crystal rod by performing an operation on the doped YAG crystal ingot. The operation may include at least one of a cutting operation, a grinding operation, or a polishing operation. The method may also include preparing a doped YAG single crystal fiber core by immersing at least a portion of the doped YAG crystal rod in an acid solution and reacting for a preset time under a preset condition. The preset condition may include a preset temperature and a first preset magnetic stirring rate. The preset temperature may be in a range of 200 to 300° C. The first preset magnetic stirring rate may be in a range of 200 to 300 revolutions per minute (rpm). The method may also include performing a cylindrical surface polishing operation on the doped YAG single crystal fiber core by stirring a polishing liquid at a second preset magnetic stirring rate. The polishing liquid may include a polishing powder. The second preset magnetic stirring rate may be in a range of 300 to 500 rpm. The cylindrical surface polishing operation may include immersing the doped YAG single crystal fiber core into a container containing the polishing liquid by using a clamp, placing the container on a magnetic stirrer, and performing the cylindrical surface polishing operation on the doped YAG single crystal fiber core by causing a stirring magnet of the magnetic stirrer to rotate in the container and to drive the polishing liquid to rotate. The method may also include placing the doped YAG single crystal fiber core into a growth zone of a growth chamber and placing a raw material into a dissolution zone of the growth chamber. The method may also include adding a mineralizer into the growth chamber to cause the mineralizer to immerse the raw material and the doped YAG single crystal fiber core. The method may also include heating the growth zone and the dissolution zone by a two-stage heating device, respectively. A temperature of the dissolution zone may be higher than a temperature of the growth zone. The method may also include preparing a doped YAG single crystal fiber by growing a YAG single crystal fiber cladding on a surface of the doped YAG single crystal fiber core based on the doped YAG single crystal fiber core and the raw material under a preset pressure.

In some embodiments, the acid solution may include at least one of a concentrated phosphoric acid solution, a concentrated sulfuric acid solution, or a concentrated hydrochloric acid solution.

In some embodiments, the method may further include rinsing the doped YAG single crystal fiber core using a cleaning solution.

In some embodiments, a mass fraction of a polishing powder in the polishing liquid may be in a range of 5% to 10%.

In some embodiments, the polishing powder may include at least one of silicon oxide or corundum.

In some embodiments, the mineralizer may include a potassium carbonate ($K_2CO_3$) solution, a sodium carbonate ($Na_2CO_3$) solution, a potassium fluoride (KF) solution, an ammonium fluoride ($NH_4F$) solution, a potassium hydroxide (KOH) solution, or a sodium hydroxide (NaOH) solution.

In some embodiments, before heating the growth zone and the dissolution zone by a two-stage heating device, respectively, the method may further include sealing the growth chamber; placing the sealed growth chamber in a safety device; sealing the sealed growth chamber and the safety device as a whole; and placing the sealed whole in the two-stage heating device.

In some embodiments, the temperature of the dissolution zone may be in a range of 635° C. to 650° C. The temperature of the growth zone may be in a range of 610° C. to 630° C.

In some embodiments, the preset pressure may be in a range of 120 MPa to 160 MPa.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which like reference numerals represent similar structures, and wherein.

Figure 1:
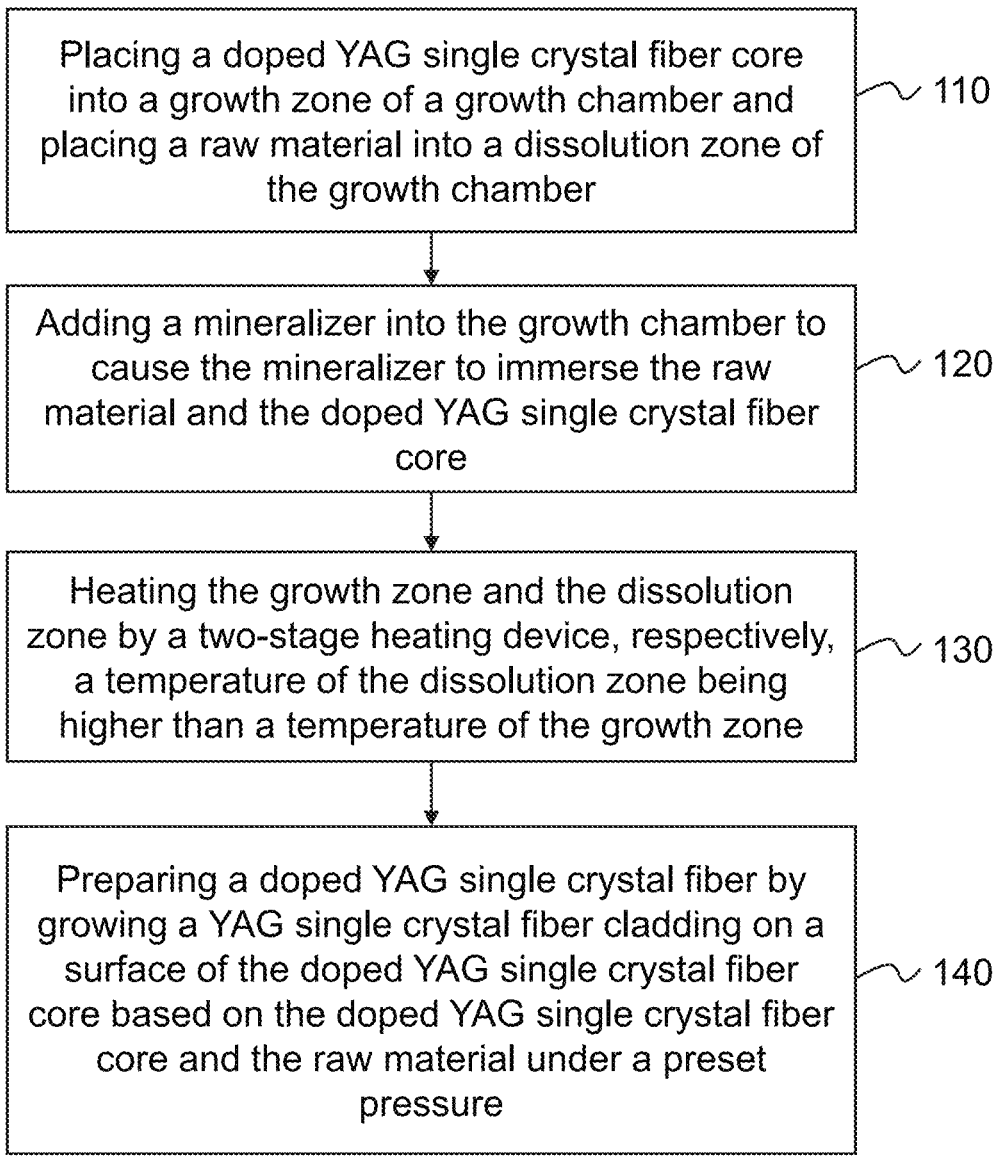
FIG. 1 is a flowchart illustrating an exemplary process for preparing a doped YAG single crystal fiber according to some embodiments of the present disclosure.

In figures, 300 represents a device for preparing a fiber core, 310 represents a container, 331 represents a first hole, 332 represents a second hole, 340 represents a doped YAG crystal rod, and 350 represents a stirring magneton. 400 represents a device for preparing a fiber, 410 represents a growth chamber, 411 represents a growth zone, 412 represents a dissolution zone, 413 represents a doped YAG single crystal fiber core, 414 represents a raw material, 415 represents a baffle, 416 represents a fixing assembly, 417 represents a supporting assembly, 420 represents a safety device, 430 represents a two-stage heating device, 431 represents a first heating device, 432 represents a second heating device, and 433 represents a thermal insulation layer. 710 represents a polished Nd:YAG single crystal fiber core according to some embodiments of the present disclosure, and 720 represents a stainless steel rod 910 represents a polished Nd:YAG single crystal fiber core according to some embodiments of the present disclosure, and 920 represents a stainless steel rod.

DETAILED DESCRIPTION

In the following detailed description, numerous specific details are set forth by way of examples in order to provide a thorough understanding of the relevant disclosure. Obviously, drawings described below are only some examples or embodiments of the present disclosure. Those skilled in the art, without further creative efforts, may apply the present disclosure to other similar scenarios according to these drawings. It should be understood that the purposes of these illustrated embodiments are only provided to those skilled in the art to practice the application, and not intended to limit the scope of the present disclosure. Unless obviously obtained from the context or the context illustrates otherwise, the same numeral in the drawings refers to the same structure or operation.

It will be understood that the terms "system," "device," "unit," and/or "module" used herein are one method to distinguish different components, elements, parts, sections, or assemblies of different levels. However, the terms may be displaced by another expression if they achieve the same purpose.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

The flowcharts used in the present disclosure illustrate operations that systems implement according to some embodiments in the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

Some embodiments of the present disclosure provide methods for preparing a doped Yttrium Aluminum Garnet (YAG) single crystal fiber. A doped YAG crystal rod may be prepared by performing an operation on a doped YAG crystal ingot. The operation may include at least one of a cutting operation, a grinding operation, a polishing operation, or the like, or any combination thereof. A doped YAG single crystal fiber core may be prepared by immersing at least a portion of the doped YAG crystal rod in an acid solution and reacting for a preset time under a preset condition. The doped YAG single crystal fiber core may be placed into a growth zone of a growth chamber, and a raw material (e.g., an yttrium oxide ($Y_2O_3$) powder, an aluminum oxide ($Al_2O_3$) powder) may be placed into a dissolution zone of the growth chamber. A mineralizer (e.g., a potassium carbonate ($K_2CO_3$) solution, a sodium carbonate ($Na_2CO_3$) solution, a potassium fluoride (KF) solution, an ammonium fluoride ($NH_4F$) solution, a potassium hydroxide (KOH) solution, or a sodium hydroxide (NaOH) solution) may be added into the growth chamber to cause the mineralizer to immerse the raw material and the doped YAG single crystal fiber core. The growth zone and the dissolution zone may be heated by a two-stage heating device, respectively, and a doped YAG single crystal fiber may be prepared by growing a YAG single crystal fiber cladding on a surface of the doped YAG single crystal fiber core based on the doped YAG single crystal fiber core and the raw material under a preset pressure. Further, a doped YAG single crystal fiber core with a uniform diameter may be prepared by performing a cylindrical surface polishing operation on the doped YAG single crystal fiber core, which may improve a surface smoothness of the doped YAG single crystal fiber core, reduce a surface roughness of the doped YAG single crystal fiber core, reduce a transmission loss of the doped YAG single crystal fiber, and improve a transmission quality of the doped YAG single crystal fiber. The doped YAG single crystal fiber prepared according to some embodiments of the present disclosure has a smooth surface, a uniform diameter, a relatively high thermal conductivity, and a relatively high transmission quality.

FIG. 1 is a flowchart illustrating an exemplary process for preparing a doped YAG single crystal fiber according to some embodiments of the present disclosure. In some embodiments, process 100 may be executed automatically by a control system. For example, the process 100 may be implemented by a control instruction. The control system may control one or more devices to achieve one or more operations of the process 100 based on the control instruction. In some embodiments, the process 100 may be executed semi-automatically. For example, one or more operations of the process 100 may be manually executed by an operator. In some embodiments, the process 100 may be accomplished with one or more additional operations not described, and/or without one or more of the operations discussed. Additionally, the order of the operations of the process 100 illustrated in FIG. 1 and described below is not intended to be limiting.

In 110, a doped Yttrium Aluminum Garnet (YAG) single crystal fiber core may be placed into a growth zone of a growth chamber and a raw material may be placed into a dissolution zone of the growth chamber. In some embodiments, operation 110 may be performed by a movable device (e.g., a robotic arm) or manually by an operator.

The doped YAG single crystal fiber core may be pre-prepared. In some embodiments, a doped YAG crystal rod may be prepared first, then the doped YAG single crystal fiber core may be prepared by refining the doped YAG crystal rod using an acid solution. More descriptions regarding the preparation of the doped YAG single crystal fiber core may be found elsewhere in the present disclosure (e.g., FIG. 2 and the descriptions thereof).

As used herein, the growth chamber refers to a place where a doped YAG single crystal fiber is prepared by growing a YAG single crystal fiber cladding on a surface of a fiber core (e.g., the doped YAG single crystal fiber core). In some embodiments, the growth chamber may include an autoclave. In some embodiments, the autoclave may be made of stainless steel, carbon manganese steel, nickel base alloy, titanium alloy, or the like, or any combination thereof. In some embodiments, a shape of the growth chamber may include a cylinder, a cuboid, a cube, a prism, etc. In some embodiments, the growth chamber may include the growth zone and the dissolution zone, which are used to place the fiber core and the raw material, respectively. In some embodiments, the growth zone may be located above the dissolution zone. In some embodiments, a volume of the growth zone may be greater than, equal to, or less than a volume of the dissolution zone. In some embodiments, a volume ratio of the growth zone to the dissolution zone may be 2:3, 3:4, 4:5, 1:1, 3:2, 4:3, 5:3, etc. More descriptions regarding the growth chamber may be found elsewhere in the present disclosure (e.g., FIG. 4 and the descriptions thereof).

The raw material may include yttrium oxide, aluminum oxide, etc. In some embodiments, a purity of the raw material may be greater than or equal to 95%, 98%, 99%, 99.9%, 99.99%, 99.999%, etc. In some embodiments, the raw material may be in a form of powder, block, granule, or the like, or any combination thereof.

In 120, a mineralizer may be added into the growth chamber to cause the mineralizer to immerse the raw material and the doped YAG single crystal fiber core. In some embodiments, operation 120 may be performed by the movable device (e.g., the robotic arm) or manually by the operator.

The mineralizer may be used to increase a dissolvability of the raw material (e.g., yttrium oxide, aluminum oxide). In some embodiments, the mineralizer may include a potassium carbonate ($K_2CO_3$) solution, a sodium carbonate ($Na_2CO_3$) solution, a potassium fluoride (KF) solution, an ammonium fluoride ($NH_4F$) solution, a potassium hydroxide (KOH) solution, a sodium hydroxide (NaOH) solution, or the like, or any combination thereof. In some embodiments, a concentration of the mineralizer may be in a range of 0.5 mol/L to 5 mol/L. In some embodiments, the concentration of the mineralizer may be in a range of 1 mol/L to 4 mol/L. In some embodiments, the concentration of the mineralizer may be in a range of 1.5 mol/L to 3.5 mol/L. In some embodiments, the concentration of the mineralizer may be in a range of 2 mol/L to 3 mol/L.

In 130, the growth zone and the dissolution zone may be heated by a two-stage heating device, respectively. A temperature of the dissolution zone may be higher than a temperature of the growth zone.

In some embodiments, the temperature of the dissolution zone may be 600° C. to 700° C., and the temperature of the growth zone may be 580° C. to 680° C. In some embodiments, the temperature of the dissolution zone may be 610° C. to 690° C., and the temperature of the growth zone may be 585° C. to 675° C. In some embodiments, the temperature of the dissolution zone may be 615° C. to 670° C., and the temperature of the growth zone may be 590° C. to 650° C. In some embodiments, the temperature of the dissolution zone may be 620° C. to 665° C., and the temperature of the growth zone may be 595° C. to 645° C. In some embodiments, the temperature of the dissolution zone may be 625° C. to 660° C., and the temperature of the growth zone may be 600° C. to 640° C. In some embodiments, the temperature of the dissolution zone may be 630° C. to 655° C., and the temperature of the growth zone may be 605° C. to 635° C. In some embodiments, the temperature of the dissolution zone may be 635° C. to 650° C., and the temperature of the growth zone may be 610° C. to 630° C. In some embodiments, the temperature of the dissolution zone may be 640° C. to 645° C., and the temperature of the growth zone may be 615° C. to 625° C.

As used herein, the two-stage heating device refers to a heating device including two independent heating units, and the two independent heating units may be used to heat the growth zone and the dissolution zone, respectively. In some embodiments, at least one of independent heating units may include one or more heating sub-units each of which can be configured to heat a portion of the growth zone (or the dissolution zone). In some embodiments, temperatures of different portions of the growth zone (or the dissolution zone) may be different. In some embodiments, the two independent heating units may be separated by a thermal insulation layer (e.g., a light high-alumina brick) to improve a temperature gradient between the growth zone and the dissolution zone. In some embodiments, the temperature gradient between the growth zone and the dissolution zone (or temperature gradients within the growth zone or the dissolution zone) may be adjusted by adjusting one or more heating parameters (e.g., a current, a resistance, a power) associated with the two independent heating units (or the heating sub-units). In some embodiments, the two-stage heating device may include a resistance furnace, a heating coil (e.g., a ring heating coil), an electromagnetic furnace, or the like, or any combination thereof.

In some embodiments, before the growth zone and the dissolution zone are heated by the two-stage heating device, respectively, the growth chamber may be sealed (e.g., sealed by welding). The sealed growth chamber may be placed into a safety device. The sealed growth chamber and the safety device may be sealed as a whole, and the sealed whole may be further placed into the two-stage heating device. More descriptions regarding the two-stage heating device and the safety device may be found elsewhere in the present disclosure (e.g., FIG. 4 and the descriptions thereof).

In 140, the doped YAG single crystal fiber may be prepared by growing the YAG single crystal fiber cladding on the surface of the doped YAG single crystal fiber core based on the doped YAG single crystal fiber core and the raw material under a preset pressure.

In some embodiments, the preset pressure may be in a range of 110 MPa-170 MPa. In some embodiments, the preset pressure may be in a range of 115 MPa-165 MPa. In some embodiments, the preset pressure may be in a range of 120 MPa-160 MPa. In some embodiments, the preset pressure may be in a range of 125 MPa-155 MPa. In some embodiments, the preset pressure may be in a range of 130 MPa-150 MPa. In some embodiments, the preset pressure may be in a range of 135 MPa-145 MPa. In some embodiments, the preset pressure may be 140 MPa.

As described in connection with operation 130, during a process for heating the growth zone and the dissolution zone, a portion of solvent (e.g., deionized water) of the mineralizer in the growth chamber may be constantly vaporized to cause a pressure in the growth chamber to reach the preset pressure. Meanwhile, the raw material (e.g., yttrium oxide, aluminum oxide) in the dissolution zone may be constantly dissolved in the mineralizer to form a saturated solution. Since the temperature of the dissolution zone is higher than the temperature of the growth zone, a convection of solution may be formed in the growth chamber. The saturated solution with higher temperature in the dissolution zone may be transported to the growth zone. In addition, since the temperature of the growth zone is relatively low, the saturated solution transported to the growth zone may gradually be supersaturated, so that a solute (e.g., yttrium oxide, aluminum oxide) may be constantly precipitated on the surface of the YAG single crystal fiber core. As a result, the doped YAG single crystal fiber may be prepared by growing the YAG single crystal fiber cladding with a preset thickness on the surface of the doped YAG single crystal fiber core.

It should be noted that the above description of the process 100 is merely provided for the purposes of illustration, and not intended to limit the scope of the present disclosure. For persons having ordinary skills in the art, multiple variations or modifications on the process 100 may be made under the teachings of the present disclosure. However, those variations and modifications do not depart from the scope of the present disclosure. For example, the process 100 may also be used to prepare other single crystal fibers (e.g., Yttrium Aluminum Perovskite (YAP) single crystal fibers, Lithium Yttrium Fluoride (LYF) single crystal fibers), not limited to the doped YAG single crystal fiber.

Figure 2:
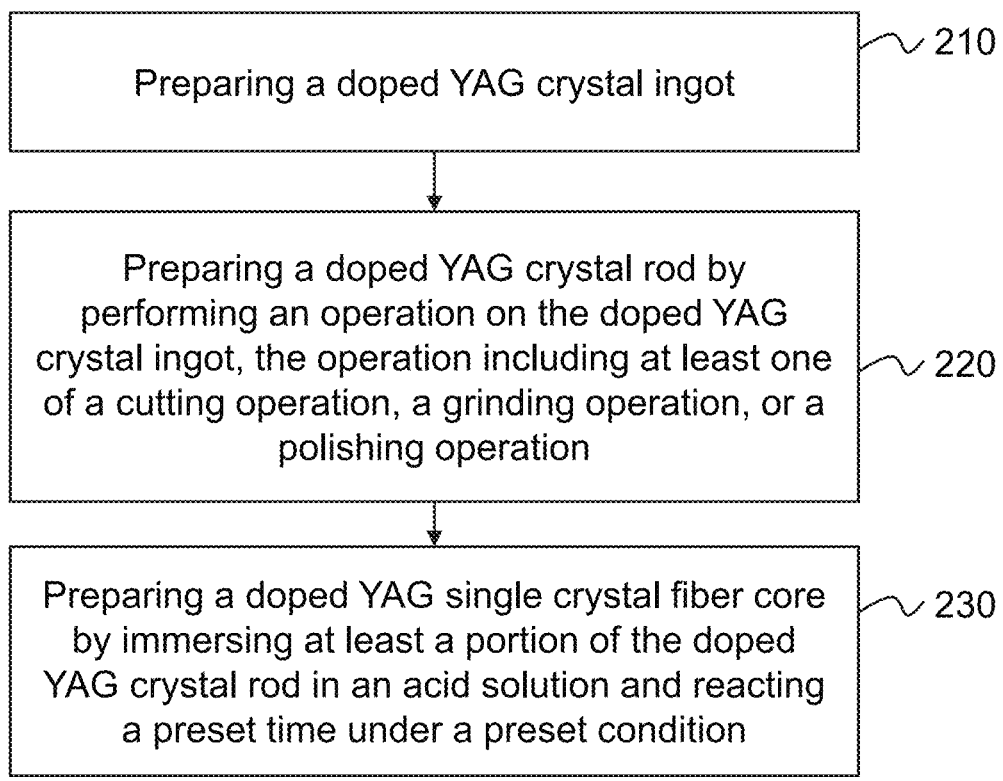
FIG. 2 is a flowchart illustrating an exemplary process for preparing a doped YAG single crystal fiber core according to some embodiments of the present disclosure.

FIG. 2 is a flowchart illustrating an exemplary process for preparing a doped YAG single crystal fiber core according to some embodiments of the present disclosure. In some embodiments, process 200 may be executed automatically by a control system. For example, the process 200 may be implemented by a control instruction. The control system may control one or more devices to complete one or more operations of the process 200 based on the control instruction. In some embodiments, the process 200 may be executed semi-automatically. For example, one or more operations of the process 200 may be manually executed by an operator. In some embodiments, the process 200 may be accomplished with one or more additional operations not described, and/or without one or more of the operations discussed. Additionally, the order in which the operations of the process 200 as illustrated in FIG. 2 and described below is not intended to be limiting.

In 210, a doped YAG ingot may be prepared. In some embodiments, a diameter of the doped YAG ingot may be in a range of 20 mm-80 mm. In some embodiments, the diameter of the doped YAG ingot may be in a range of 25 mm-70 mm. In some embodiments, the diameter of the doped YAG ingot may be in a range of 30 mm-60 mm. In some embodiments, the diameter of the doped YAG ingot may be in a range of 35 mm-50 mm. In some embodiments, the diameter of the doped YAG ingot may be in a range of 40 mm-45 mm.

In some embodiments, a length of the doped YAG ingot may be in a range of 80 mm-160 mm. In some embodiments, the length of the doped YAG ingot may be in a range of 90 mm-155 mm. In some embodiments, the length of the doped YAG ingot may be in a range of 100 mm-150 mm. In some embodiments, the length of the doped YAG ingot may be in a range of 110 mm-140 mm. In some embodiments, the length of the doped YAG ingot may be in a range of 120 mm-130 mm.

In some embodiments, a doped element doped in the doped YAG ingot may include chromium (Cr), neodymium (Nd), holmium (Ho), erbium (Er), thulium (Tm), ytterbium (Yb), or the like, or any combination thereof. In some embodiments, a doped concentration of the doped element in the doped YAG ingot may be in a range of 1%-4%. In some embodiments, the doped concentration of the doped element may be in a range of 1.5%-3.5%. In some embodiments, the doped concentration of the doped element may be in a range of 2%-3%. In some embodiments, the doped concentration of the doped element may be in a range of 2.2%-2.6%. As used herein, the doped concentration of the doped element in the doped YAG ingot refers to an amount of $Y^{3+}$ lattice sites in YAG occupied by the doped element through substitutional doping. For example, a molecular formula of the doped YAG may be expressed as $(X_xY_{1-x})_3Al_5O_{12}$, wherein X denotes the doped element and x denotes the doped concentration of the doped element.

In some embodiments, the doped YAG crystal ingot may be prepared by a crystal growth technique (e.g., a Czochralski technique, a hydrothermal technique, a region melting technique, a sublimation technique, an epitaxial growth technique). Merely by way of example, the YAG crystal ingot may be prepared according to the Czochralski technique. In some embodiments, the Czochralski technique may include operations including material melting, seed crystal preheating, seed crystal introducing, temperature adjustment, necking, shoulder release, equal diameter growth, ending, cooling, crystal extraction, etc. In some embodiments, during a lifting process, a flowing gas may be also introduced to prevent oxide particles generated by an oxidation of a portion of an iridium-gold crucible in a crystal growth device from adhering to a surface of the YAG crystal ingot, thereby affecting a quality of the YAG crystal ingot. In some embodiments, a flowing rate of the flowing gas may be in a range of 3 mL/min-6 mL/min. In some embodiments, the flowing gas may include an inert gas (e.g., helium, argon), nitrogen, a mixed gas including an inert gas and oxygen, a mixed gas including nitrogen and oxygen, etc. In some embodiments, a volume ratio of oxygen in the mixed gas may be in a range of 4%-6%. In some embodiments, the volume ratio of oxygen in the mixed gas may be in a range of 4.5%-5%. More descriptions of the Czochralski technique may be found in the International Patent Application No. PCT/CN2019/101693, filed on Aug. 21, 2019, and the International Patent Application No. PCT/CN2019/101691, filed on Aug. 21, 2019, the contents of each of which are incorporated herein by reference.

In 220, a doped YAG crystal rod may be prepared by performing an operation on the doped YAG crystal ingot. The operation may include at least one of a cutting operation, a grinding operation, a polishing operation, or the like, or any combination thereof.

As used herein, the cutting operation refers to cutting off the doped YAG crystal ingot with a tool (e.g., a machine tool) under a preset condition (e.g., a preset pressure) to make a size of the doped YAG crystal ingot reach a predetermined size (a product may be referred to as "a cutting intermediate"). The grinding operation refers to processing a surface of an object to be ground (e.g., the doped YAG crystal ingot or the cutting intermediate) through a relative movement between a grinding tool and the object to be ground under a preset pressure (a product may be referred to as "a grinding intermediate"). The polishing operation refers to processing a surface of an object to be polished (e.g., the doped YAG crystal ingot, the cutting intermediate, or the grinding intermediate) with a polishing medium to reduce a roughness of the object to be polished, thereby making the surface of the object to be polished smooth.

In some embodiments, a diameter of the doped YAG crystal rod may be smaller than a preset diameter threshold. For example, the diameter of the doped YAG crystal rod may be in a range of 1 mm to 2 mm. In some embodiments, the diameter of the doped YAG crystal rod may be in a range of 1.2 mm to 1.8 mm. In some embodiments, the diameter of the doped YAG crystal rod may be in a range of 1.4 mm to 1.6 mm.

In some embodiments, a length of the doped YAG crystal rod may be less than a preset length threshold. For example, the length of the YAG crystal rod may be in a range of 3 cm to 5 cm. In some embodiments, the length of the YAG crystal rod may be in a range of 3.2 cm to 4.8 cm. In some embodiments, the length of the YAG crystal rod may be in a range of 3.4 cm to 4.6 cm. In some embodiments, the length of the YAG crystal rod may be in a range of 3.6 cm to 4.4 cm. In some embodiments, the length of the YAG crystal rod may be in a range of 3.8 cm to 4.2 cm.

In 230, a doped YAG single crystal fiber core may be prepared by immersing at least a portion of the doped YAG crystal rod into an acid solution and reacting for a preset time under a preset condition. In some embodiments, operation 230 may be implemented by a fiber core preparation device shown in FIG. 3.

In some embodiments, a diameter of the doped YAG single crystal fiber core may be in a range of 80 μm-220 μm. In some embodiments, the diameter of the doped YAG single crystal fiber core may be in a range of 100 μm-200 μm. In some embodiments, the diameter of the doped YAG single crystal fiber core may be in a range of 120 μm-180 μm. In some embodiments, the diameter of the doped YAG single crystal fiber core may be in a range of 140 μm-160 μm. In some embodiments, the diameter of the doped YAG single crystal fiber core may be 150 μm.

In some embodiments, a length of the doped YAG single crystal fiber core may be in a range of 20 mm-40 mm. In some embodiments, the length of the doped YAG single crystal fiber core may be in a range of 25 mm-35 mm. In some embodiments, the length of the doped YAG single crystal fiber core may be in a range of 28 mm-32 mm. In some embodiments, the length of the doped YAG single crystal fiber core may be 30 mm.

In some embodiments, the acid solution may include a concentrated phosphoric acid solution, a concentrated sulfuric acid solution, a concentrated hydrochloric acid solution, or the like, or any combination thereof.

In some embodiments, a mass fraction of solute in the concentrated phosphoric acid solution (also can be referred to as a mass fraction of the concentrated phosphoric acid solution for brevity) may be in a range of 85% to 90%. In some embodiments, the mass fraction of the concentrated phosphoric acid solution may be in a range of 86% to 89%. In some embodiments, the mass fraction of the concentrated phosphoric acid solution may be in a range of 87% to 88%.

In some embodiments, a mass fraction of solute in the concentrated sulfuric acid solution (also can be referred to as a mass fraction of the concentrated sulfuric acid solution for brevity) may be in a range of 67% to 98%. In some embodiments, the mass fraction of the concentrated sulfuric acid solution may be in a range of 70% to 95%. In some embodiments, the mass fraction of the concentrated sulfuric acid solution may be in a range of 73% to 92%. In some embodiments, the mass fraction of the concentrated sulfuric acid solution may be in a range of 75% to 90%. In some embodiments, the mass fraction of the concentrated sulfuric acid solution may be in a range of 77% to 88%. In some embodiments, the mass fraction of the concentrated sulfuric acid solution may be in a range of 80% to 85%.

In some embodiments, a mass fraction of solute in the concentrated hydrochloric acid solution (also can be referred to as a mass fraction of the concentrated hydrochloric acid solution for brevity) may be in a range of 36% to 38%.

Merely by way of example, the acid solution may be a mixed solution including a concentrated sulfuric acid solution and a concentrated sulfuric acid solution, wherein a mass fraction of the concentrated phosphoric acid solution may be in a range of 85% to 90%, a mass fraction of the concentrated sulfuric acid solution may be in a range of 67% to 98%, and a volume ratio of the concentrated phosphoric acid solution and the concentrated sulfuric acid solution may be in a range of 1:(1~4) (e.g., 1:1, 1:1.5, 1:2, 1:3, 1:4).

In some embodiments, the preset condition may include a preset temperature and a preset magnetic stirring rate. In some embodiments, the preset temperature may be in a range of 140° C. to 360° C. In some embodiments, the preset temperature may be in a range of 160° C. to 340° C. In some embodiments, the preset temperature may be in a range of 180° C. to 320° C. In some embodiments, the preset temperature may be in a range of 200° C. to 300° C. In some embodiments, the preset temperature may be in a range of 210° C. to 290° C. In some embodiments, the preset temperature may be in a range of 220° C. to 280° C. In some embodiments, the preset temperature may be in a range of 230° C. to 270° C. In some embodiments, the preset temperature may be in a range of 240° C. to 260° C. In some embodiments, the preset temperature may be 250° C.

In some embodiments, the preset magnetic stirring rate may be in a range of 150 rpm to 350 rpm. In some embodiments, the preset magnetic stirring rate may be in a range of 180 rpm to 320 rpm. In some embodiments, the preset magnetic stirring rate may be in a range of 200 rpm to 300 rpm. In some embodiments, the preset magnetic stirring rate may be in a range of 210 rpm to 290 rpm. In some embodiments, the preset magnetic stirring rate may be in a range of 220 rpm to 280 rpm. In some embodiments, the preset magnetic stirring rate may be in a range of 230 rpm to 270 rpm. In some embodiments, the preset magnetic stirring rate may be in a range of 240 rpm to 260 rpm. In some embodiments, the preset magnetic stirring rate may be 250 rpm.

In some embodiments, the preset time may be in a range of 4 h to 8 h. In some embodiments, the preset time may be in a range of 4.5 h to 7.5 h. In some embodiments, the preset time may be in a range of 5 h to 7 h. In some embodiments, the preset time may be in a range of 5.5 h to 6.5 h. In some embodiments, the preset time may be 6 h.

In some embodiments, the doped YAG single crystal fiber core may be rinsed using a cleaning solution to remove the acid solution remaining on a surface of the doped YAG single crystal fiber core. In some embodiments, the cleaning solution may include ethanol, water, methanol, N-propanol, isopropanol, acetone, or the like, or any combination thereof. In some embodiments, the rinsed doped YAG single crystal fiber core may be dried to remove the cleaning solution remaining on the surface of the doped YAG single crystal fiber core.

In some embodiments, the doped YAG single crystal fiber core may be polished using a polishing liquid to improve a surface smoothness of the doped YAG single crystal fiber core and reduce a surface roughness of the doped YAG single crystal fiber core. During a polishing process, a cylindrical surface polishing operation may be performed on the doped YAG single crystal fiber core. In some embodiments, the cylindrical surface polishing operation may be performed by stirring the polishing liquid using a stirrer (e.g., a magnetic stirrer, a mechanical stirrer, an ultrasound mixer) at a preset stirring rate. In some embodiments, the stirrer may be equipped with a temperature control device which is configured to control a temperature of the polishing liquid.

In some embodiments, the preset stirring rate (e.g., a preset magnetic stirring rate) may be in a range of 200 rpm to 600 rpm. In some embodiments, the preset stirring rate may be in a range of 250 rpm to 550 rpm. In some embodiments, the preset stirring rate may be in a range of 280 rpm to 520 rpm. In some embodiments, the preset stirring rate may be in a range of 300 rpm to 500 rpm. In some embodiments, the preset stirring rate may be in a range of 320 rpm to 480 rpm. In some embodiments, the preset stirring rate may be in a range of 350 rpm to 450 rpm. In some embodiments, the preset stirring rate may be in a range of 370 rpm to 420 rpm. In some embodiments, the preset stirring rate may be 400 rpm.

In some embodiments, the temperature of the polishing liquid may be within a predetermined temperature range. In some embodiments, the temperature range may be 20° C. to 150° C. In some embodiments, the temperature range may be 25° C. to 130° C. In some embodiments, the temperature range may be 30° C. to 100° C. In some embodiments, the temperature range may be 40° C. to 90° C. In some embodiments, the temperature range may be 50° C. to 80° C. In some embodiments, the temperature range may be 60° C. to 70° C. In some embodiments, the temperature of the polishing liquid may be 65° C.

In some embodiments, the polishing liquid may include a polishing powder. In some embodiments, a mass fraction of the polishing powder in the polishing liquid may be in a range of 3% to 20%. In some embodiments, the mass fraction of the polishing powder in the polishing liquid may be in a range of 4% to 15%. In some embodiments, the mass fraction of the polishing powder in the polishing liquid may be in a range of 5% to 10%. In some embodiments, the mass fraction of the polishing powder in the polishing liquid may be in a range of 5.5% to 9.5%. In some embodiments, the mass fraction of the polishing powder in the polishing liquid may be in a range of 6% to 9%. In some embodiments, the mass fraction of the polishing powder in the polishing liquid may be in a range of 6.5% to 8.5%. In some embodiments, the mass fraction of polishing powder in the polishing liquid may be in a range of 7% to 8%.

In some embodiments, a particle diameter of the polishing powder may be in a range of 20 nm to 200 nm. In some embodiments, the particle diameter of the polishing powder may be in a range of 30 nm to 180 nm. In some embodiments, the particle diameter of the polishing powder may be in a range of 40 nm to 150 nm. In some embodiments, the particle diameter of the polishing powder may be in a range of 50 nm to 100 nm. In some embodiments, the particle diameter of the polishing powder may be in a range of 55 nm to 95 nm. In some embodiments, the particle diameter of the polishing powder may be in a range of 60 nm to 90 nm. In some embodiments, the particle diameter of the polishing powder may be in a range of 65 nm to 85 nm. In some embodiments, the particle diameter of the polishing powder may be in a range of 70 nm to 80 nm. In some embodiments, the particle diameter of the polishing powder may be 75 nm. In some embodiments, the polishing powder may include silicon oxide, corundum, or the like, or any combination thereof.

In some embodiments, a pH value of the polishing liquid may be adjusted using an acidic (e.g., hydrochloric acid, sulfuric acid, nitric acid, phosphoric acid) solution to cause a difference between the pH value of the polishing liquid and a preset pH value to be less than a preset threshold. Thus, a polishing effect of the polishing liquid on the doped YAG single crystal fiber core can be improved. In some embodiments, the preset pH value may be in a range of 3 to 5. In some embodiments, the preset pH value may be in a range of 3.2 to 4.8. In some embodiments, the preset pH value may be in a range of 3.4 to 4.6. In some embodiments, the preset pH value may be in a range of 3.6 to 4.4. In some embodiments, the preset pH value may be in a range of 3.8 to 4.2. In some embodiments, the preset pH value may be 4. In some embodiments, the preset threshold may be in a range of 0.1 to 0.5. In some embodiments, the preset threshold may be in a range of 0.2 to 0.4. In some embodiments, the preset threshold may be 0.3.

In some embodiments, a polishing time may be in a range of 1 min to 30 min. In some embodiments, the polishing time may be in a range of 2 min to 28 min. In some embodiments, the polishing time may be in a range of 5 min to 25 min. In some embodiments, the polishing time may be in a range of 7 min to 23 min. In some embodiments, the polishing time may be in a range of 10 min to 20 min. In some embodiments, the polishing time may be in a range of 12 min to 18 min. In some embodiments, the polishing time may be in a range of 14 min to 16 min. In some embodiments, the polishing time may be 15 min.

In some embodiments, an effect of the cyclical surface polishing operation may be adjusted by adjusting the preset stirring rate, the temperature of the polishing liquid, mass fraction of the polishing powder in the polishing liquid, a practical diameter of the polishing powder, a polishing time, or the like, or any combination thereof. In some embodiments, the cyclical surface polishing operation may be performed by using a polishing medium (e.g., a flexible medium, a viscous medium, a fluid medium) instead of a polishing liquid.

In some embodiments, the polished YAG single crystal fiber core may be further cleaned to remove the polishing liquid adhered on the surface of the doped YAG single crystal fiber core. For example, the doped YAG single crystal fiber core may be cleaned by an ultrasonic cleaning machine.

It should be noted that the above description of the process 200 is merely provided for the purposes of illustration, and not intended to limit the scope of the present disclosure. For persons having ordinary skills in the art, multiple variations and modifications on the process 200 may be made under the teachings of the present disclosure. However, those variations and modifications do not depart from the scope of the present disclosure. For example, the process 200 may be also used to prepare a polycrystalline fiber core (e.g., a ceramic fiber core). As another example, the process 200 may be further used to prepare other single crystal fiber cores, and not limited to the doped YAG single crystal fiber core.

Figure 3:
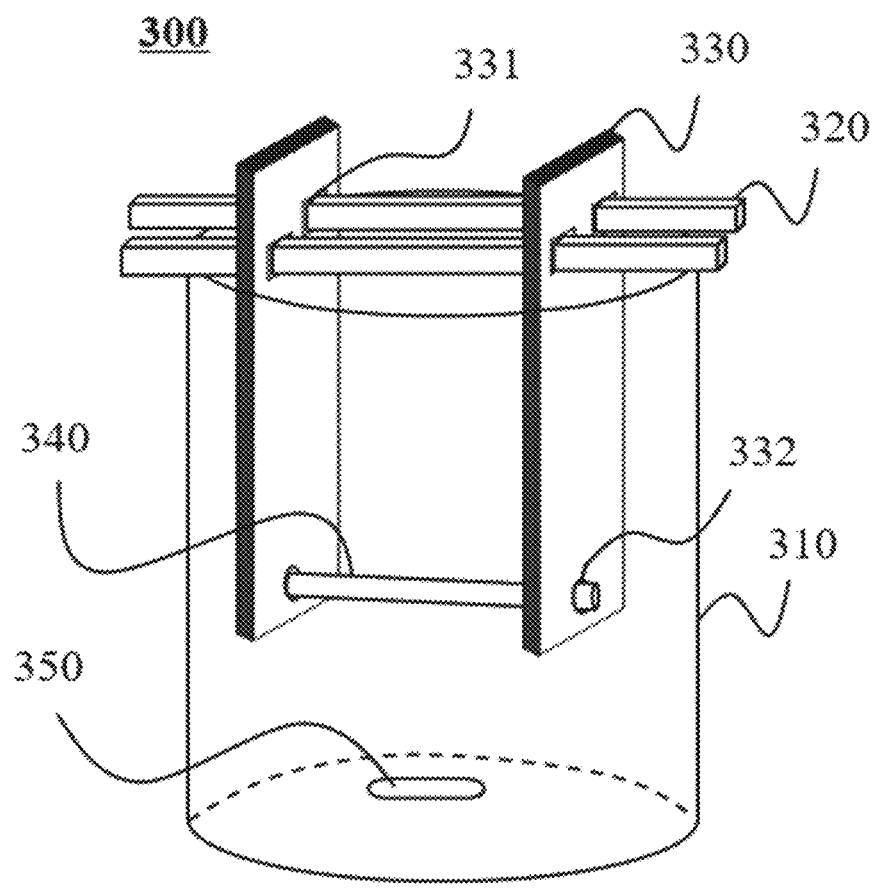
FIG. 3 is a schematic diagram illustrating an exemplary device for preparing a fiber core according to some embodiments of the present disclosure.

FIG. 3 is a schematic diagram illustrating an exemplary device for preparing a fiber core according to some embodiments of the present disclosure. As shown in FIG. 3, a device 300 for preparing a fiber core (also can be referred to as a "fiber core preparation device 300") may include a container 310, a supporting rod 320, a supporting plate 330, and a magnetic stirrer (not shown in FIG. 3).

The container 310 may be used to accommodate an acidic solution. In some embodiments, the container 310 may include a glass container, a ceramic container, a plastic container, or any other container that does not chemically react with the acid solution. In some embodiments, a shape of the container 310 may include a cylinder, a cube, a rectangular cuboid, a prism, etc.

The supporting rod 320 and the supporting plate 330 may be connected to each other for supporting a doped YAG crystal rod 340. For example, the supporting rod 320 may be connected to an upper end of the supporting plate 330. Both ends of the supporting rod 320 may be disposed on the top (e.g., an opening) of the container 310, respectively. The YAG crystal rod 340 may be placed at a lower end of the supporting plate 330 and immersed in the acid solution. As shown in FIG. 3, the upper end of the supporting plate 330 may be equipped with one or more (e.g., 1, 2, 3) first holes 331. The supporting rod 320 may be connected to the supporting plate 330 through the one or more first holes 331. The lower end of the supporting plate 330 may be equipped with one or more second holes 332. The doped YAG crystal rod 340 may be connected to the supporting plate 330 through the one or more second holes 332.

In some embodiments, a count of the supporting rods 320 may be a default setting value (e.g., 1, 2, 3) or may be set according to different situations. For example, the supporting rods 320 may include two parallel rods. Similarly, a count of the supporting plates 330 may be a default setting value (e.g., 1, 2, 3) or may be set according to different situations. For example, the supporting plates 330 may include two parallel plates. In some embodiments, the supporting rod 320 may include a glass rod, a ceramic rod, a plastic rod, or any other rod that does not chemically react with the acid solution. Similarly, the supporting plate 330 may include a glass plate, a ceramic plate, a plastic plate, or any other plate that does not chemically reacted with the acid solution.

The magnetic stirrer (not shown) may be disposed at a bottom of the container 310 for stirring the acid solution, thereby accelerating the preparation of the doped YAG single crystal fiber core. In some embodiments, the magnetic stirrer may also be used to stir a polishing liquid to polish (e.g., perform a cylindrical surface polishing operation on) the doped YAG single crystal fiber core. In some embodiments, the magnetic stirrer may include a stirring magneton 350 and a power device (not shown in the figure).

Figure 4:
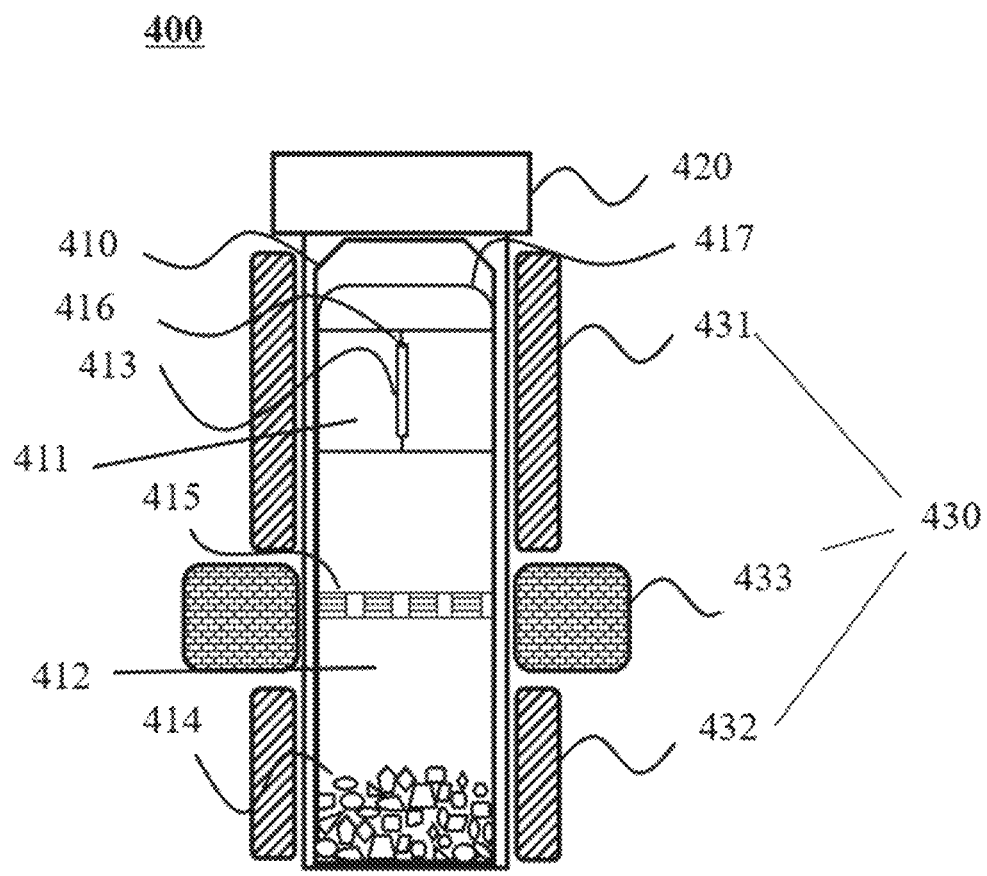
FIG. 4 is a schematic diagram illustrating an exemplary device for preparing a fiber according to some embodiments of the present disclosure.

FIG. 4 is a schematic diagram illustrating an exemplary device for preparing a fiber according to some embodiments of the present disclosure. As shown in FIG. 4, a device 400 for preparing a fiber (also can be referred to as a "fiber preparation device 400") may include a growth chamber 410, a safety device 420, and a two-stage heating device 430.

The growth chamber 410 may include a growth zone 411 and a dissolution zone 412. The growth zone 411 may be configured to contain a doped YAG single crystal fiber core 413 and the dissolution zone 412 may be configured to contain a raw material 414. In some embodiments, the growth chamber 410 may further include a baffle 415 for dividing the growth zone 411 and the dissolution zone 412. The baffle 415 may have one or more holes through which a convection of solution may be formed in the growth chamber 410. In some embodiments, the baffle 415 may have a preset aperture ratio to equilibrate a convection speed of solution between the growth zone 411 and the dissolution zone 412. As used herein, an aperture ratio refers to a ratio of a total area of the one or more holes on the baffle 415 to an area of the baffle 415. In some embodiments, the preset aperture ratio may be in a range of 4% to 13%. In some embodiments, the preset aperture ratio may be in a range of 5% to 12%. In some embodiments, the preset aperture ratio may be in a range of 6% to 11%. In some embodiments, the preset aperture ratio may be in a range of 7% to 10%. In some embodiments, the preset aperture ratio may be in a range of 8% to 9%. In some embodiments, the preset aperture ratio may be in a range of 8.5%.

In some embodiments, the doped YAG single crystal fiber core 413 may be fixed into the growth chamber 410 by a fixing assembly 416 and a supporting assembly 417. In some embodiments, the fixing assembly 416 may include a silver wire, a gold wire, etc. The supporting assembly 417 may include a silver wire frame, a gold wire frame, etc.

The safety device 420 may be configured to protect the growth chamber 410. For example, a preset volume of deionized water may be filled in a gap between the safety device 420 and the growth chamber 410. When the safety device 420 is heated to a preset temperature, at least a portion of the deionized water in the gap may be vaporized to generate a certain pressure, so that the pressure inside and outside the growth chamber 410 can be balanced, thereby protecting the growth chamber 410. In some embodiments, the safety device 420 may be made of any temperature-resistant and pressure-resistant material, for example, stainless steel, carbon steel, low alloy steel, etc. In some embodiments, a shape of the safety device 420 may be the same as or different from a shape of the growth chamber 410. For example, the shape of the safety device 420 may be a cylinder, a cube, a rectangular cuboid, a prism, etc.

The two-stage heating device 430 may be configured to provide a temperature required for growing a YAG single crystal fiber cladding. In some embodiments, the two-stage heating device 430 may include a first heating device 431 and a second heating device 432. The first heating device 431 may be configured to heat the growth zone 411 and the second heating device 432 may be configured to heat the dissolution zone 412. In some embodiments, the first heating device 431 or the second heating device 432 may include a resistance furnace, a heating coil (e.g., a ring heating coil), an electromagnetic furnace, or the like, or any combination thereof. In some embodiments, the two-stage heating device 430 may further include a thermal insulation layer 433. The thermal insulation layer 433 may be disposed between the first heating device 431 and the second heating device 432 for increasing a temperature gradient of the growth zone 411 and the dissolution zone 412, thereby increasing a growth rate of the YAG single crystal fiber cladding. In some embodiments, the thermal insulation layer 433 may include a light high-alumina brick, a diatomite brick, a light clay brick, a light silicon brick, or the like, or any combination thereof.

In some embodiments, an installation of the fiber preparation device 400 may be implemented by one or more following operations.

At step 1, the raw material 414 (e.g., yttrium oxide, aluminum oxide) may be placed on a bottom (i.e., the dissolution zone 412) of the growth chamber 410.

At step 2, the baffle 415 may be placed into the growth chamber 410 to divide the growth chamber 410 into the growth zone 411 and the dissolution zone 412.

At step 3, a preset volume of a mineralizer may be added into the growth chamber 410. In some embodiments, the preset volume may be 65% to 75% of a volume of the growth chamber 410. In some embodiments, the preset volume may be 68% to 72% of the volume of the growth chamber 410. In some embodiments, the preset volume may be 70% of the volume of the growth chamber 410.

At step 4, the doped YAG single crystal fiber core 413 may be fixed to the supporting assembly 417 (e.g., a silver wire frame) by the fixing assembly 416 (e.g., a silver wire).

At step 5, the supporting assembly 417 (e.g., the silver wire frame) that is fixed with the doped YAG single crystal fiber core 413 may be put into the growth chamber 410 to cause the doped YAG single crystal fiber core 413 to locate within the growth zone 411.

At step 6, the growth chamber 410 may be sealed. For example, the growth chamber 410 may be sealed by welding.

At step 7, the sealed growth chamber 410 may be loaded into the safety device 420.

At step 8, the preset volume of the deionized water may be filled in the gap between the growth chamber 410 and the safety device 420 to balance pressures inside and outside the chamber 410, thereby protecting the growth chamber 410. In some embodiments, the preset volume may be 60% to 70% of a volume of the gap between the growth chamber 410 and the safety device 420.

At step 9, the safety device 420 may be sealed. For example, a metal ring cone may be used to seal the safety device 420.

At step 10, the sealed safety device 420 may be placed into the two-stage heating device 430 so that the first heating device 431 heats the growth zone 411 and the second heating device 432 heats the dissolution zone 412.

Embodiment 1

A doped concentration of Nd was set as 0.01 and raw materials required for generating an Nd:YAG crystal ingot were calculated as including: 42.4 g $Nd_2O_3$, 2816.8 g $Y_2O_3$, and 2141.2 g $Al_2O_3$. A purity of each of the raw materials was greater than or equal to 99.99%. After the raw materials were mixed, the mixed raw material was poured into a mold and pressed into a block under a pressure of 140 MPa. The block was calcined at 1300° C. for 12 hours and an Nd:YAG block was prepared. The Nd:YAG block was placed into an iridium-gold crucible in a single crystal furnace. A YAG single crystal with a [111] orientation was used as a seed crystal. A Nd:YAG crystal ingot was prepared after single crystal furnace charging operation, vacuum pumping operation, nitrogen introducing operation, material melting operation, seed crystal preheating operation, seed crystal introducing operation, temperature adjustment operation, necking operation, shoulder release operation, equal diameter growth operation, ending operation, cooling operation, crystal extraction operation, etc. A flowing rate of flowing nitrogen was 3 mL/min. During the growth of the Nd:YAG crystal ingot, a rotational speed of the seed crystal was 15 rpm, a lifting speed of the seed crystal was 0.6 mm/h, a growth temperature was 2000° C., and a growth time was 15 days.

Figure 5:
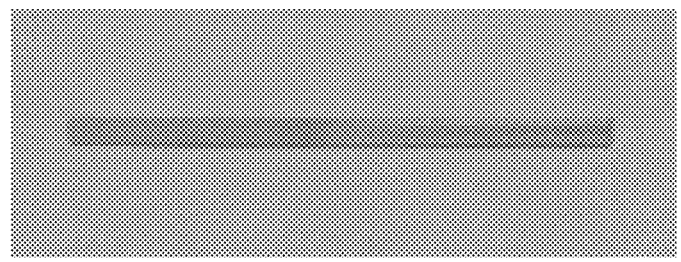
FIG. 5 is a schematic diagram illustrating an exemplary doped YAG crystal rod according to some embodiments of the present disclosure.

An Nd:YAG crystal rod shown in FIG. 5 was prepared by performing a cutting operation, a grinding operation, and a polishing operation on the Nd:YAG crystal ingot. The Nd:YAG crystal rod had a diameter of 1.7 mm and a length of 3 cm.

150 mL of a concentrated sulfuric acid solution with a mass fraction of 67% and 150 mL of a concentrated phosphoric acid solution with a mass fraction of 85% were mixed and poured into the container 310 (e.g., a glass beaker). The stirring magneton 350 was placed into the container 310. Two ends of the Nd:YAG crystal rod were wrapped with a preset thickness of a sealing tape and were inserted into second holes 332 of two parallel supporting plates 330 (e.g., glass plates), respectively. In the embodiment, a value of the preset thickness is not limiting, as long as the Nd:YAG rod can be fixed in the second holes 332. Both ends of each of the two rectangular supporting rods 320 were inserted into two first holes 331 of the two parallel supporting plates 330. The two rectangular supporting rods 320 were placed on the opening of the container 310 to allow the Nd:YAG crystal rod to be completely immersed into the mixed acidic solution in the container 310. The container 310 was placed on a heating magnetic stirrer. A magnetic stirring rate was 250 rpm, a heating temperature was 250° C., and a heating stirring time was 6 hours. A dissolved Nd:YAG crystal rod was removed and an Nd:YAG single crystal fiber core shown in FIG. 6A was prepared by rinsing the dissolved Nd:YAG crystal rod with ethanol. The Nd:YAG single crystal fiber core had a diameter of 111.5 μm and a length of 2.5 cm.

A polishing liquid with 5% mass fraction of corundum was prepared. A pH value of the polishing liquid was adjusted to 3 using a hydrochloric acid solution with a solute mass fraction of 37%. The Nd:YAG single crystal fiber core was immersed in a container (e.g., the container 310) containing the polishing liquid by using a clamp and a central axis of the Nd:YAG single crystal fiber core was made to coincide with a central axis of the container. The container was placed on a magnetic stirrer and the stirring magneton 350 was rotated in the container to drive the polishing liquid to rotate to polish the Nd:YAG single crystal fiber core. The magnetic stirring rate was 300 rpm and the polishing time was 24 hours. After the Nd:YAG single crystal fiber core was polished, the Nd:YAG single crystal fiber core was cleaned for 1 minute by an ultrasonic cleaning machine to remove the polishing liquid adhered on a surface of the Nd:YAG single crystal fiber core. The polished Nd:YAG single crystal fiber core shown in FIG. 6B was prepared. A diameter of the Nd:YAG single crystal fiber core was 101.1 μm. Compared with a non-polished Nd:YAG single crystal fiber core (shown in FIG. 6A), the polished Nd:YAG single crystal fiber core had a higher surface smoothness and a lower surface roughness.

Figure 7:
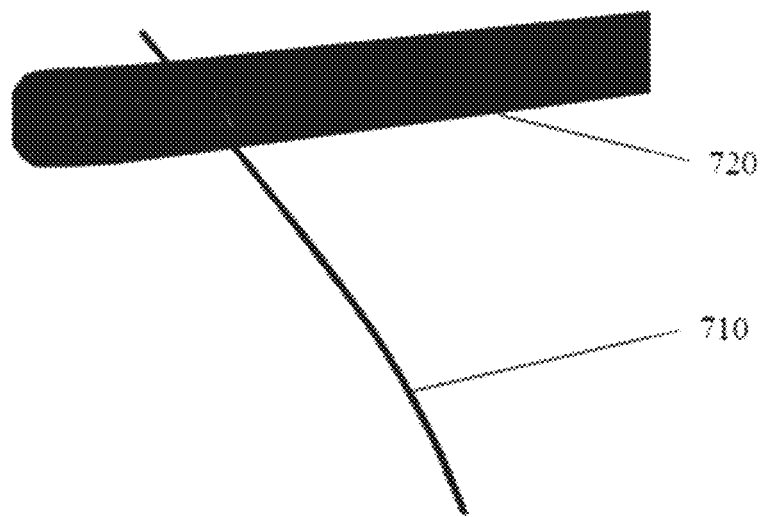
FIG. 7 is a schematic diagram illustrating an exemplary bending performance test of a polished Nd:YAG single crystal fiber core according to some embodiments of the present disclosure.

FIG. 7 is a schematic diagram illustrating an exemplary bending performance test of a polished Nd:YAG single crystal fiber core according to some embodiments of the present disclosure. As shown in FIG. 7, line 710 represents the polished Nd:YAG single crystal fiber core and rod 720 represents a stainless steel rod. According to FIG. 7, the Nd:YAG single crystal fiber core 710 prepared in the embodiment has an excellent bending performance.

Figure 6A:
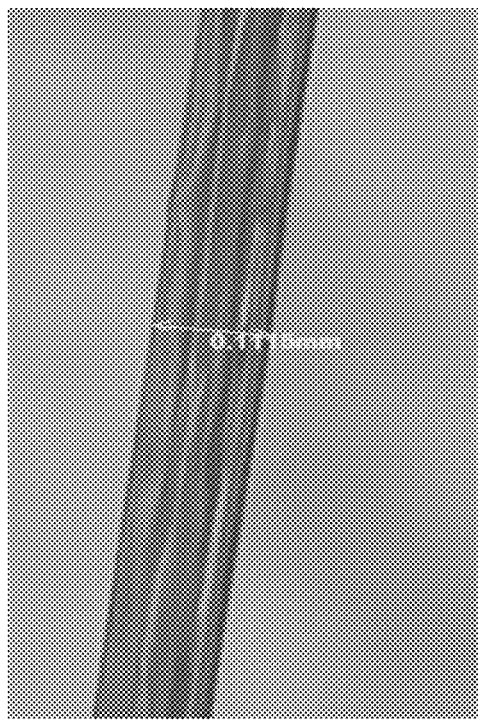
FIG. 6A is a schematic diagram illustrating an exemplary doped YAG single crystal fiber core without polishing according to some embodiments of the present disclosure.
Figure 6B:
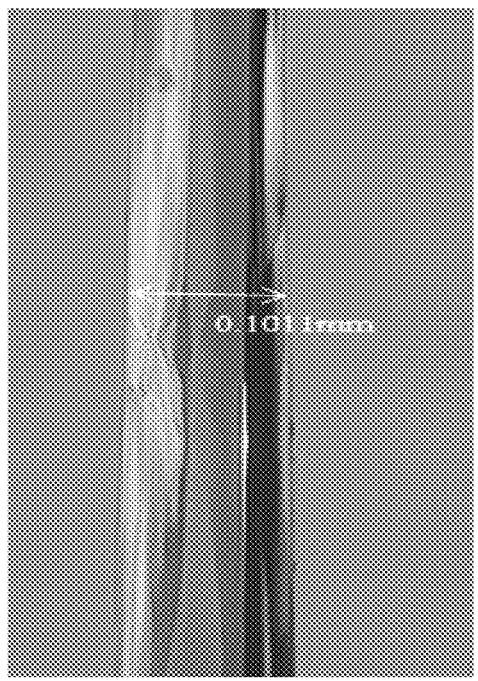
FIG. 6B is a schematic diagram illustrating an exemplary polished doped YAG single crystal fiber core according to some embodiments of the present disclosure.

FIGS. 6A, 6B, and 7 were obtained by performing an enlarging capture by an automatic image measuring instrument VMS-3020E.

Further, raw materials required for growing the YAG single crystal fiber cladding was calculated as including: 2.85 g $Y_2O_3$ and 2.14 g $Al_2O_3$. The above raw materials were placed into the dissolution zone 412 of the growth chamber 410 (e.g., a silver inner liner) having a diameter of 20 mm and a height of 150 mm. The baffle 415 (e.g., a silver baffle) with an aperture ratio of 9% was placed into the growth chamber 410. A $K_2CO_3$ solution with 2 mol/L was poured into the growth chamber 410 and a volume of the $K_2CO_3$ solution was 65% of a volume of the growth chamber 410. The Nd:YAG single crystal fiber core was fixed to the supporting assembly 417 (e.g., a silver wire frame) by the fixing assembly 416 (e.g., a silver wire). The supporting assembly 417 (e.g., a silver wire frame) fixed with the Nd:YAG single crystal fiber core was put into the growth chamber 410 to cause the Nd:YAG single crystal fiber core to locate in the growth zone 411 and to be immersed by the $K_2CO_3$ solution.

The growth chamber 410 was sealed by welding and the sealed growth chamber 410 was loaded into the safety device 420. In order to balance pressures inside and outside the growth chamber 410 to protect the growth chamber 410, deionized water was filled in a gap between the growth chamber 410 and the safety device 420 and a volume of the deionized water was 70% of a volume of the gap.

The safety device 420 was sealed using a metal ring cone and the sealed safety device 420 was placed into the two-stage heating device 430 (e.g., a two-stage independent heating resistance furnace). The thermal insulation layer 433 (e.g., a light high-alumina brick) was disposed between the first heating device 431 and the second heating device 432. A heating temperature of the second heating device 432 was set as 635° C. and a heating temperature of the first heating device 431 was set as 610° C. Pressures in both the safety device 420 and the growth chamber 410 were 140 MPa and a reaction time was 20 days. After the reaction was completed, a temperature of the two-stage heating device 430 was cooled to the room temperature and a Nd:YAG single crystal fiber was obtained. The Nd:YAG single crystal fiber was rinsed using the deionized water to remove the raw material residue adhered on a surface of the Nd:YAG single crystal fiber. The prepared Nd:YAG single crystal fiber had a smooth surface and a uniform diameter. A thickness of the YAG single crystal fiber cladding was 420 μm.

Embodiment 2

A doped concentration of Nd was set as 0.01, and raw materials required for generating an Nd:YAG crystal ingot were calculated as including: 42.4 g $Nd_2O_3$, 2816.8 g $Y_2O_3$, and 2141.2 g $Al_2O_3$. A purity of each of the raw materials was greater than or equal to 99.99%. After the raw materials were mixed, the mixed raw material was poured into a mold and pressed into a block under a pressure of 140 MPa. The block was calcined at 1300° C. for 12 hours, and an Nd:YAG block was prepared. The Nd:YAG block was placed into an iridium-gold crucible in a single crystal furnace. A YAG single crystal with a [111] orientation was used as a seed crystal. A Nd:YAG crystal ingot was prepared after single crystal furnace charging operation, vacuum pumping operation, nitrogen introducing operation, material melting operation, seed crystal preheating operation, seed crystal introducing operation, temperature adjustment operation, necking operation, shoulder release operation, equal diameter growth operation, ending operation, cooling operation, crystal extraction operation, etc. A flowing rate of flowing nitrogen was 3 mL/min. During the growth of the Nd:YAG crystal ingot, a rotational speed of the seed crystal was 15 rpm, a lifting speed of the seed crystal was 0.6 mm/h, a growth temperature was 2000° C., and a growth time was 15 days.

An Nd:YAG crystal rod shown in FIG. 5 was prepared by performing a cutting operation, a grinding operation, and a polishing operation on the Nd:YAG crystal ingot. The Nd:YAG crystal rod had a diameter of 1.7 mm and a length of 3 cm.

150 mL of a concentrated sulfuric acid solution with a mass fraction of 70% and 150 mL of a concentrated phosphoric acid solution with a mass fraction of 88% were mixed and poured into the container 310 (e.g., a glass beaker). The stirring magneton 350 was placed into the container 310. (e.g., a glass plate). Two ends of the Nd:YAG crystal rod were wrapped with a preset thickness of a sealing tape and were inserted into second holes 332 of two parallel supporting plates 330 (e.g., glass plates), respectively. In the embodiment, a value of the preset thickness is not limiting, as long as the Nd:YAG rod can be fixed in the second holes 332. Both ends of each of the two rectangular supporting rods 320 were inserted into two first holes 331 of the two parallel supporting plates 330. The two rectangular supporting rods 320 were placed on the opening of the container 310 to allow the Nd:YAG crystal rod to be completely immersed into the mixed acidic solution in the container 310. The container 310 was placed on a heating magnetic stirrer. A magnetic stirring rate was 250 rpm, a heating temperature was 300° C., and a heating stirring time was 7 hours. A dissolved Nd:YAG crystal rod was removed and an Nd:YAG single crystal fiber core shown in FIG. 8A was prepared by rinsing the dissolved Nd:YAG crystal rod with ethanol. The Nd:YAG single crystal fiber core had a diameter of 95.9 μm and a length of 2.5 cm.

A polishing liquid with 5% mass fraction of corundum was prepared. A pH value of the polishing liquid was adjusted to 4 using a hydrochloric acid solution with a solute mass fraction of 37%. The Nd:YAG single crystal fiber core was immersed in a container (e.g., the container 310) containing the polishing liquid by using a clamp and a central axis of the Nd:YAG single crystal fiber core was made to coincide with a central axis of the container. The container was placed on a magnetic stirrer and the stirring magneton 350 was rotated in the container to drive the polishing liquid to rotate to polish the Nd:YAG single crystal fiber core. The magnetic stirring rate was 500 rpm, and the polishing time was 40 hours. After the Nd:YAG single crystal fiber core was polished, the Nd:YAG single crystal fiber core was cleaned for 1 minute by an ultrasonic cleaning machine to remove the polishing liquid adhered on a surface of the Nd:YAG single crystal fiber core. The polished Nd:YAG single crystal fiber core shown in FIG. 8B was prepared. A diameter of the Nd:YAG single crystal fiber core was 84.3 μm. Compared with a non-polished Nd:YAG single crystal fiber core (shown in FIG. 8A), the polished Nd:YAG single crystal fiber core had a higher surface smoothness and a lower surface roughness.

Figure 9:
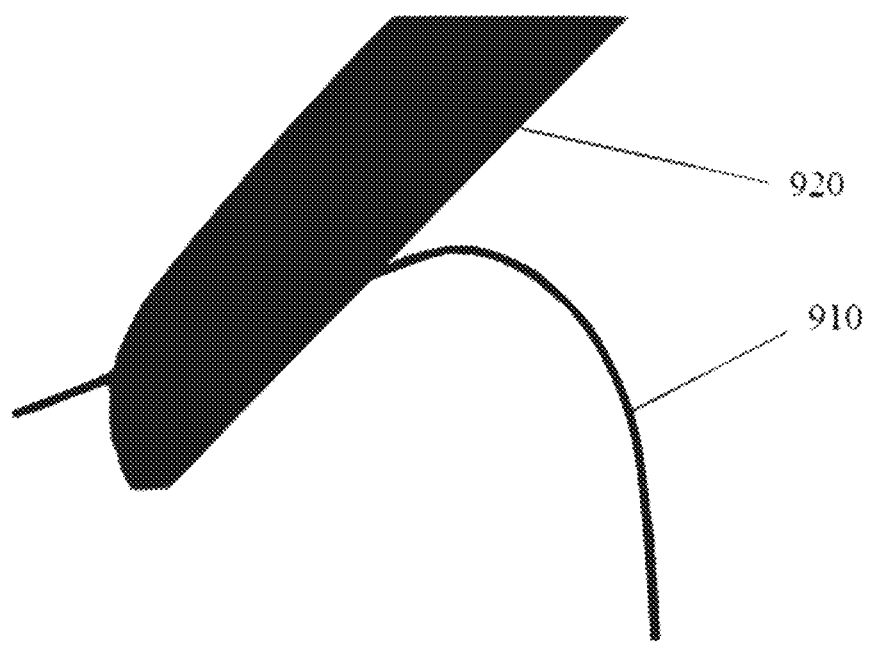
FIG. 9 is a schematic diagram illustrating an exemplary bending performance test of a polished Nd:YAG single crystal fiber core according to some embodiments of the present disclosure.

FIG. 9 is a schematic diagram illustrating an exemplary bending performance test of a polished Nd:YAG single crystal fiber core according to some embodiments of the present disclosure. As shown in FIG. 9, line 910 represents the polished Nd:YAG single crystal fiber core and rod 920 represents a stainless steel rod. According to FIG. 9, the Nd:YAG single crystal fiber core 910 prepared in the embodiment has an excellent bending performance.

Figure 8A:
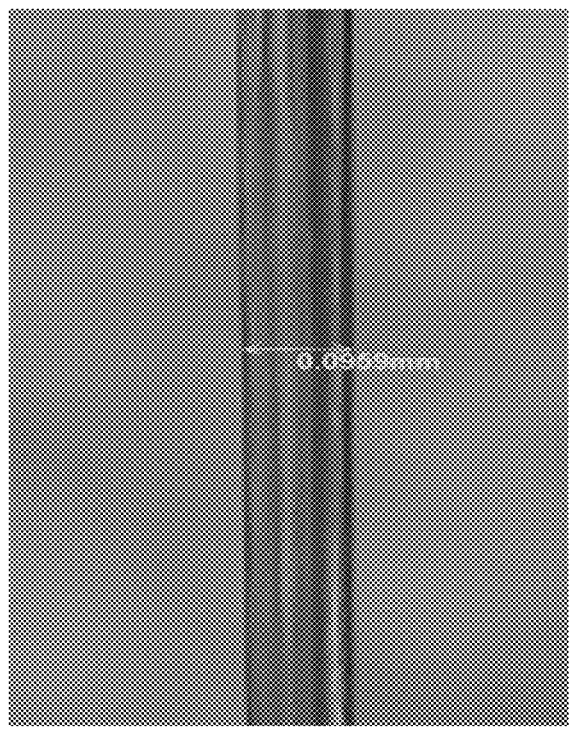
FIG. 8A is a schematic diagram illustrating an exemplary doped YAG single crystal fiber core without polishing according to some embodiments of the present disclosure.
Figure 8B:
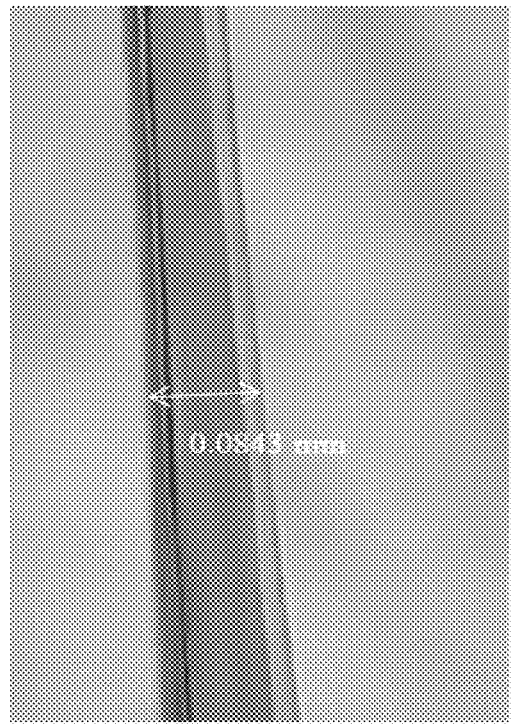
FIG. 8B is a schematic diagram illustrating an exemplary polished doped YAG single crystal fiber core according to some embodiments of the present disclosure.

FIGS. 8A, 8B, and 9 were obtained by performing an enlarging capture by an automatic image measuring instrument VMS-3020E.

Further, raw materials required for growing the YAG single crystal fiber cladding was calculated as including: 2.85 g $Y_2O_3$ and 2.14 g $Al_2O_3$. The above raw materials were placed into the dissolution zone 412 of the growth chamber 410 (e.g., a silver inner liner) having a diameter of 20 mm and a height of 150 mm. The baffle 415 (e.g., a silver baffle) with an aperture ratio of 7% was placed into the growth chamber 410. A $K_2CO_3$ solution with 1.5 mol/L was poured into the growth chamber 410 and a volume of the $K_2CO_3$ solution accounted was 75% of a volume of the growth chamber 410. The Nd:YAG single crystal fiber core was fixed to the supporting assembly 417 (e.g., a silver wire frame) by the fixing assembly 416 (e.g., a silver wire). The supporting assembly 417 (e.g., a silver wire frame) fixed with the Nd:YAG single crystal fiber core was put into the growth chamber 410 to cause the Nd:YAG single crystal fiber core to locate in the growth zone 411 and to be immersed by the $K_2CO_3$ solution.

The growth chamber 410 was sealed by welding and the sealed growth chamber 410 was loaded into the safety device 420. In order to balance pressures inside and outside the growth chamber 410 to protect the growth chamber 410, deionized water was filled in a gap between the growth chamber 410 and the safety device 420 and a volume of the deionized water was 70% of a volume of the gap.

The safety device 420 was sealed and the sealed safety device 420 was placed into the two-stage heating device 430 (e.g., a two-stage independent heating resistance furnace). The thermal insulation layer 433 (e.g., a light high-alumina brick) was disposed between the first heating device 431 and the second heating device 432. A heating temperature of the second heating device 432 was set as 650° C., and a heating temperature of the first heating device 431 was set as 630° C. Pressures in both the safety device 420 and the growth chamber 410 were 160 MPa and a reaction time was 18 days. After the reaction was completed, a temperature of the two-stage heating device 430 was cooled to the room temperature and a Nd:YAG single crystal fiber was obtained. The Nd:YAG single crystal fiber was rinsed using the deionized water to remove the raw material residue adhered on a surface of the Nd:YAG single crystal fiber. The prepared Nd:YAG single crystal fiber had a smooth surface and a uniform diameter. A thickness of the YAG single crystal fiber cladding was 350 μm.

The possible beneficial effects of the embodiments of the present disclosure may include but not limited to: (1) a doped YAG single crystal fiber core may be prepared by an acid solution immersing manner and the doped YAG single crystal fiber core may be polished, accordingly, a doped YAG single crystal fiber core with a uniform diameter can be prepared, a surface smoothness of the doped YAG single crystal fiber core can be improved, and a surface roughness of the doped YAG single crystal fiber core can be reduced, thereby reducing a transmission loss of the doped YAG single crystal fiber and improving a transmission quality of the doped YAG single crystal fiber; (2) a doped YAG single crystal fiber may be prepared by growing a YAG single crystal fiber cladding on a surface of the doped YAG single crystal fiber core, and the doped YAG single crystal fiber has a smooth surface, a uniform diameter, and a relatively high thermal conductivity and transmission quality; (3) the process for preparing the doped YAG single crystal fiber is simple and easy to operate, which can improve a preparation efficiency of the doped YAG single crystal fiber.

It should be noted that different embodiments may have different beneficial effects. In different embodiments, the possible beneficial effects may be any one of the above effects, or any combination thereof, or any other beneficial effects that may be obtained.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure, or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures, or characteristics may be combined as suitable in one or more embodiments of the present disclosure.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lies in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate" or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A method for preparing a doped Yttrium Aluminum Garnet (YAG) single crystal fiber, comprising:
   preparing a doped YAG crystal ingot;
   preparing a doped YAG crystal rod by performing an operation on the doped YAG crystal ingot, the operation including at least one of a cutting operation, a grinding operation, or a polishing operation;
   preparing a doped YAG single crystal fiber core by immersing at least a portion of the doped YAG crystal rod in an acid solution and reacting for a preset time under a preset condition, the preset condition including a preset temperature and a first preset magnetic stirring rate, wherein
      the preset temperature is in a range of 200 to 300° C.,
      the first preset magnetic stirring rate is in a range of 200 to 300 revolutions per minute (rpm);
   performing a cylindrical surface polishing operation on the doped YAG single crystal fiber core by stirring a polishing liquid at a second preset magnetic stirring rate, wherein
      the polishing liquid includes a polishing powder,
      the second preset magnetic stirring rate is in a range of 300 to 500 rpm,
      the cylindrical surface polishing operation includes:
         immersing the doped YAG single crystal fiber core into a container containing the polishing liquid by using a clamp,
         placing the container on a magnetic stirrer, and
         performing the cylindrical surface polishing operation on the doped YAG single crystal fiber core by causing a stirring magnet of the magnetic stirrer to rotate in the container and to drive the polishing liquid to rotate;
   placing the doped YAG single crystal fiber core into a growth zone of a growth chamber and placing a raw material into a dissolution zone of the growth chamber;
   adding a mineralizer into the growth chamber to cause the mineralizer to immerse the raw material and the doped YAG single crystal fiber core;
   heating the growth zone and the dissolution zone by a two-stage heating device, respectively, a temperature of the dissolution zone being higher than a temperature of the growth zone; and
   preparing a doped YAG single crystal fiber by growing a YAG single crystal fiber cladding on a surface of the doped YAG single crystal fiber core based on the doped YAG single crystal fiber core and the raw material under a preset pressure.

2. The method of claim 1, wherein the acid solution includes at least one of a concentrated phosphoric acid solution, a concentrated sulfuric acid solution, or a concentrated hydrochloric acid solution.

3. The method of claim 1, further comprising:
   rinsing the doped YAG single crystal fiber core using a cleaning solution.

4. The method of claim 1, wherein a mass fraction of the polishing powder in the polishing liquid is in a range of 5% to 10%.

5. The method of claim 4, wherein the polishing powder includes at least one of silicon oxide or corundum.

6. The method of claim 1, wherein the mineralizer includes a potassium carbonate ($K_2CO_3$) solution, a sodium carbonate ($Na_2CO_3$) solution, a potassium fluoride (KF) solution, an ammonium fluoride ($NH_4F$) solution, a potassium hydroxide (KOH) solution, or a sodium hydroxide (NaOH) solution.

7. The method of claim 1, wherein before heating the growth zone and the dissolution zone by a two-stage heating device, respectively, the method further comprises:
   sealing the growth chamber;
   placing the sealed growth chamber into a safety device;
   sealing the sealed growth chamber and the safety device as a whole; and
   placing the sealed whole into the two-stage heating device.

8. The method of claim 1, wherein
   the temperature of the dissolution zone is in a range of 635 to 650° C., and
   the temperature of the growth zone is in a range of 610 to 630° C.

9. The method of claim 1, wherein the preset pressure is in a range of 120 to 160 MPa.

* * * * *